(12) United States Patent
Hill et al.

(10) Patent No.: US 8,264,665 B2
(45) Date of Patent: Sep. 11, 2012

(54) COOLED SPIDER AND METHOD FOR GRAZING-INCIDENCE COLLECTORS

(75) Inventors: John E. Hill, Livermore, CA (US); Robert J. Munns, Livermore, CA (US)

(73) Assignee: Media Lario, S.R.L., Bosisio Parini (IT)

( * ) Notice: Subject to any disclaimer, the term of this patent is extended or adjusted under 35 U.S.C. 154(b) by 388 days.

(21) Appl. No.: 12/657,650

(22) Filed: Jan. 25, 2010

(65) Prior Publication Data
US 2011/0181860 A1    Jul. 28, 2011

(51) Int. Cl.
*G03B 27/52* (2006.01)
*G02B 7/02* (2006.01)
(52) U.S. Cl. .......................................... 355/30; 359/820
(58) Field of Classification Search ................... 355/30, 355/53, 67; 250/504 R; 359/818–820
See application file for complete search history.

(56) References Cited

U.S. PATENT DOCUMENTS

| | | |
|---|---|---|
| 7,483,223 B2 * | 1/2009 | Egle et al. .................... 359/820 |
| 8,018,574 B2 * | 9/2011 | Gayazov et al. ............... 355/53 |
| 2008/0029717 A1 * | 2/2008 | Shirai ...................... 250/504 R |

\* cited by examiner

*Primary Examiner* — Hung Henry Nguyen
(74) *Attorney, Agent, or Firm* — Opticus IP Law PLLC

(57) ABSTRACT

A cooled spider for grazing-incidence collectors includes an outer ring, an inner ring and spokes that mechanically and fluidly connect the inner and outer rings. Cooling channels in the outer and inner rings and in the spokes define a general cooling-fluid flow path through the spider. The general cooling-fluid flow path has input and output points located substantially 180° apart so that the flow path diverges at the input point into two branch flow paths that flow in opposite directions through the spider, and then converge at the output point. Input and output cooling fluid manifolds are fluidly connected to the outer ring at the input and output points and serve to flow cooling fluid over the cooling-fluid flow path.

26 Claims, 10 Drawing Sheets

COOLED SPIDER AND METHOD FOR GRAZING-INCIDENCE COLLECTORS

FIELD OF THE INVENTION

The present invention relates generally to grazing-incidence collectors (GICs), and in particular to a cooled spider and cooled spider methods for GICs.

BACKGROUND ART

EUV lithography is anticipated to be the lithographic process of choice for producing future generations of semiconductor devices having linewidths on the order of 32 nm and smaller. The wavelength of the EUV radiation is nominally 13.5 nm, which calls for the use of specialized optics to collect and image the EUV radiation.

One type of EUV optical system used to collect the radiation from the light source is a grazing-incidence collector (GIC). A GIC typically comprises one or more concentrically arranged GIC shell mirrors ("GIC shells"). The GIC shells are configured to receive light from the EUV source at grazing incidence and reflect the light to form a focused illumination beam that first forms an intermediate focus and then creates an illumination region in the far field that is preferably uniform to within a specification set by the overall system optical design.

GICs typically require a "spider" that maintains the GIC shells in a fixed position relative to one another. Prior art GIC spiders are typically designed for laboratory and non-production EUV lithography systems and so have relatively simple designs that lack active thermal management. This is problematic for a commercially viable GIC since the spider will receive prolonged exposure to EUV radiation and other radiation by-products (e.g., energetic particles, infrared radiation, etc.) that will heat the spider and potentially induce deformation to the mirrors and cause performance problems.

SUMMARY

An aspect of the invention is a cooled spider for a grazing-incident collector (GIC) that includes one or more GIC shells. The cooled spider includes an outer ring that includes a plurality of cooling channel sections, and an inner ring that includes a plurality of cooling channels loops each covering a portion of the inner ring. The cooled spider also includes a plurality of spokes that mechanically connect the inner and outer rings, with each spoke including a pair of cooling channels that fluidly connect to different cooling channel sections in the outer ring and to a cooling channel loop in the inner ring to form a cooling-fluid flow path through the spider, with each spoke configured to mechanically support an edge portion of the one or more GIC shells.

Another aspect of the invention is a method of cooling a spider that operably supports one or more shells of a GIC mirror. The method includes providing a spider having an outer ring and an inner ring mechanically and fluidly connected by a plurality of spokes and defining a cooling-fluid flow path through the spider. The method also includes flowing a cooling fluid over the cooling-fluid flow path to cool the spider.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

Figure 1A:
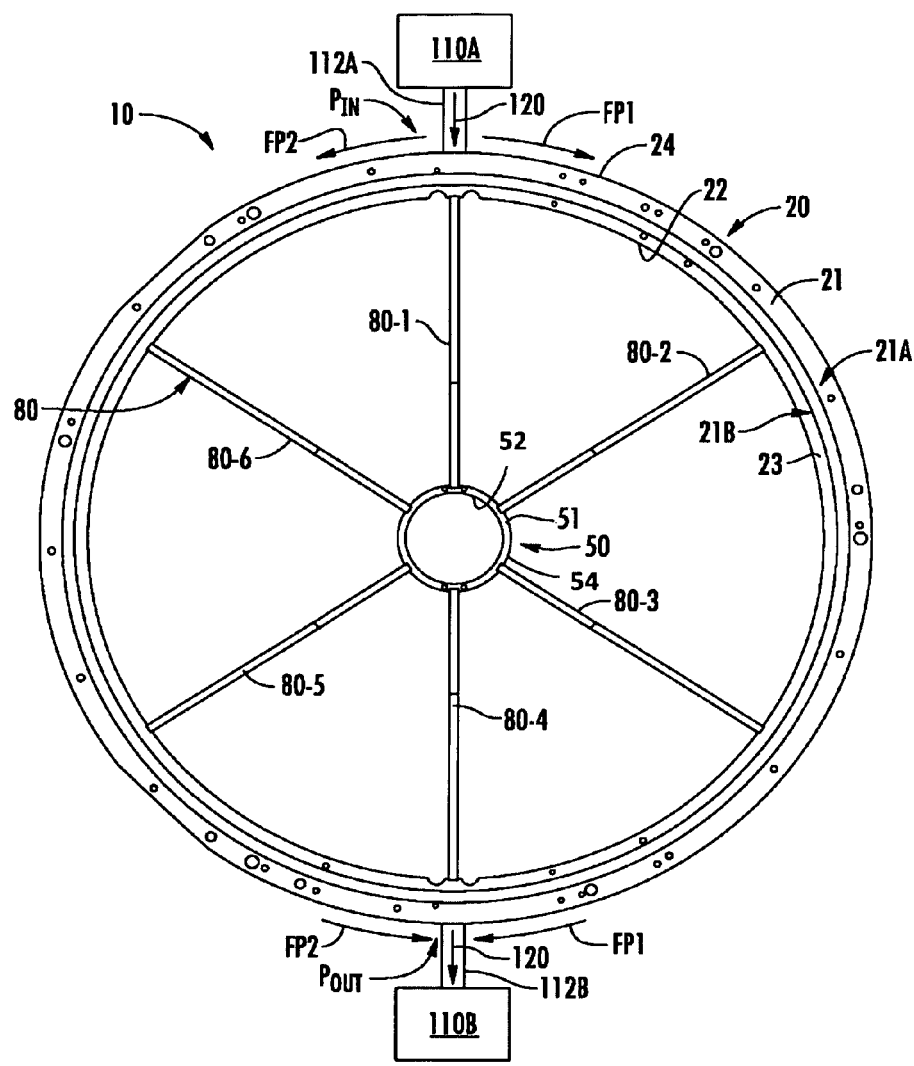
FIG. 1A is a face-on (or top down) view.

The various elements depicted in the drawing are merely representational and are not necessarily drawn to scale. Certain sections thereof may be exaggerated, while others may be minimized. For ease of illustration, not all like elements are necessarily labeled. The drawing is intended to illustrate an example embodiment of the invention that can be understood and appropriately carried out by those of ordinary skill in the art.

DETAILED DESCRIPTION

The present invention relates generally to GICs, and in particular to a cooled spider, and methods for supporting one or more GIC shells using a cooled spider. The general configuration of the cooled spider is first described, followed by details of the different components and the cooling channels of and the flow path through the spider. An EUV lithography system that employs the cooled spider is then described.

Cooled Spider

Figure 1B:
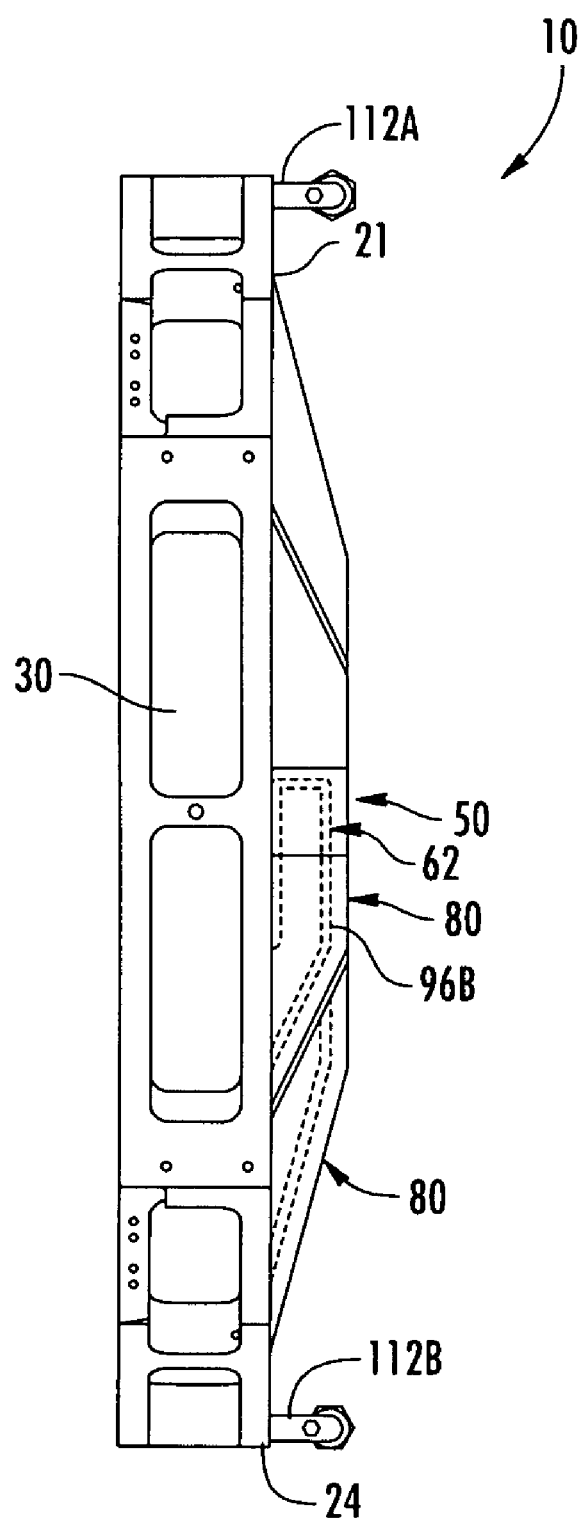
FIG. 1B is a side view.
Figure 2:
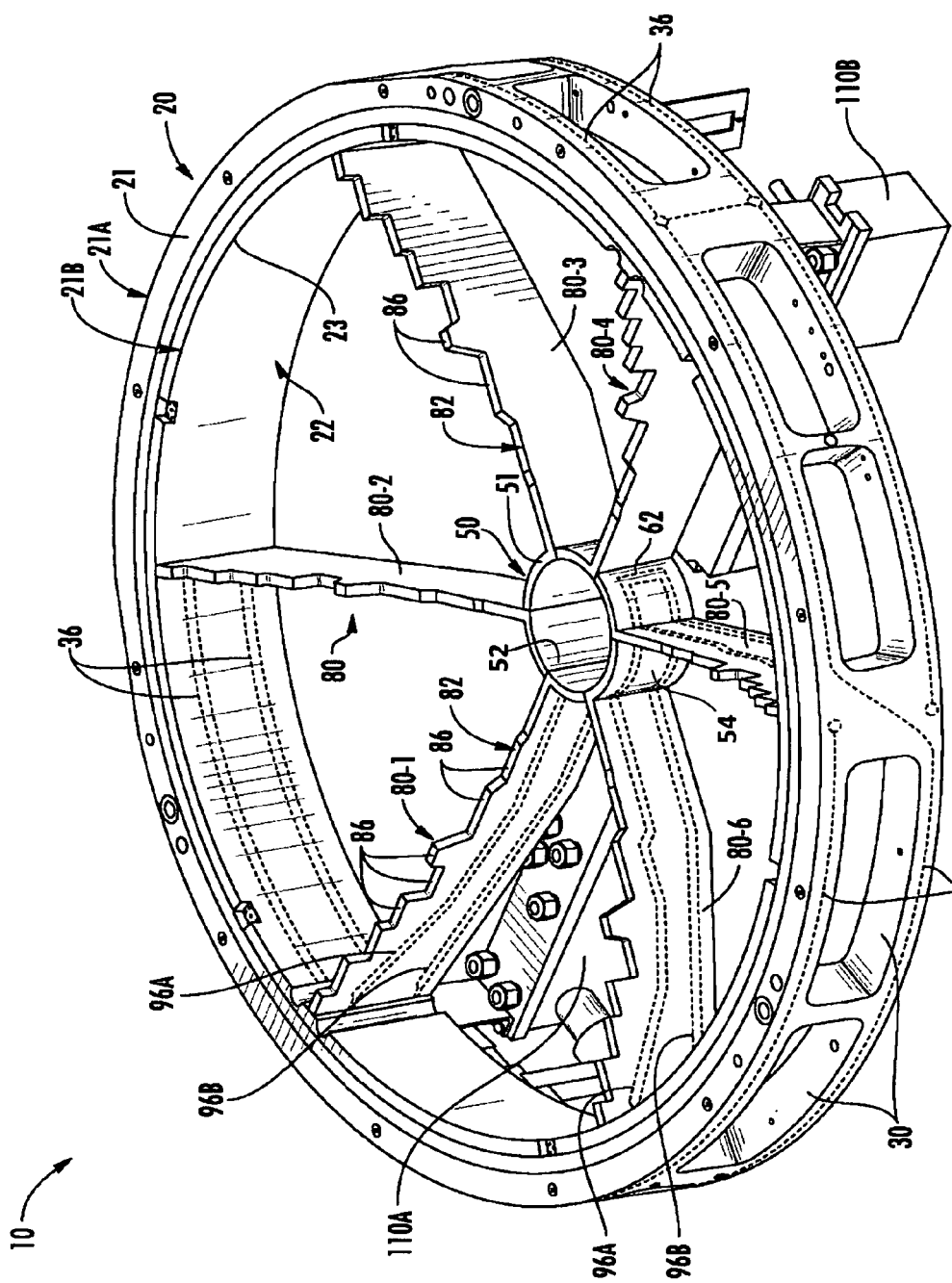
FIG. 2 is a perspective view of an example cooled spider according to the present invention.

FIG. 1 is a face-on view, FIG. 1B is a side view, and FIG. 2 is a perspective view of an example cooled spider 10 according to the present invention. Spider 10 includes an outer ring 20, an inner ring 50, and a plurality of spokes 80 (six are shown by way of illustration) that mechanically connect the inner and outer rings to provide structural support to the spider while also fluidly connecting the outer and inner rings, as described in detail below. Spokes 80, which are individually identified as 80-1, 80-2, . . . 80-6, also are configured support two or more GIC shells 200 in a spaced apart configuration, as discussed below. The angular distance between any pair adjacent spokes 80 may or may not be the same for each pair, depending on the structural and the optical performance required of the GIC mirror.

Cooled spider 10 also includes input and output cooling-fluid manifolds 110A and 110B fluidly connected to outer ring 20 via respective input and output pipes 112A and 112B at input and output points $P_{IN}$ and $P_{OUT}$, respectively. Input and output cooling-fluid manifolds 110A and 110B are used to circulate a cooling fluid 120 over a general cooling-fluid flow path through spider 10. An example cooling fluid 120 is water, which may be de-ionized water. An example material for forming spider 10 is stainless steel. Other materials include Inconel, Aluminum, Nickel or Nickel alloy for thermal compatibility with electroformed GIC shells.

Outer ring 20 includes a body portion 21 having an inner surface 22 and an outer surface 24. Body portion 21 includes a number of generally rectangular indentations 30 in outer surface 24 that reduce the weight of outer ring 20 while maintaining its structural rigidity. Outer ring 20 also includes a number of cooling channel sections 36, as described below. In an example embodiment, outer ring body portion 21 is formed from two concentrically joined inside and outside ring members 21A and 21B that in an example embodiment form an inside lip 23 (see FIG. 2).

A main function of spider 10 is to provide precise, sturdy mounting and mechanical rigidity to the assembly of one or more GIC shells. Since the spider serves as the mechanical interface of the GIC mirror to an external support that is part of a larger system (e.g., an EUV illuminator), GIC mirror alignment often comes down to spider alignment.

Because spider 10 receives thermal flux during operation of a GIC mirror that employs the spider, failure to actively control its temperature leads to a temperature drift, and therefore, dimensional changes due to a finite coefficient of thermal expansion. This is clearly undesirable as this adversely affects the optical performance of the GIC mirror.

Inner Ring Cooling Channels

Figure 3:
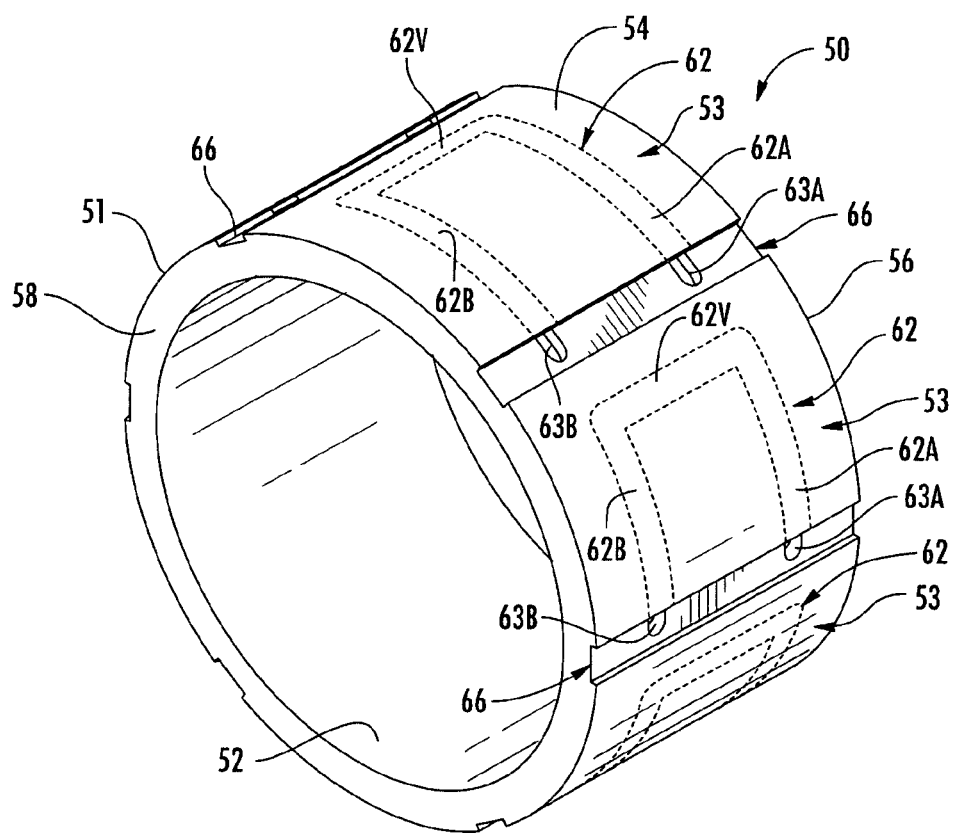
FIG. 3 is a perspective view of an example inner ring showing a cooling channel in the form of a U-shaped loop that covers a portion of the inner ring and that fluidly connects with cooling channels in one of the spokes.

FIG. 3 is a close-up perspective view of an inner ring 50. Inner ring 50 includes a body 51 having an inner surface 52, an outer surface 54, an upper edge 56 and a lower edge 58. Inner ring 50 includes, for each spoke 80, a cooling channel 62 in the form of a loop, such as the U-shaped cooling channel shown. U-shaped cooling channel 62 covers a portion 53 of inner ring 50. Each U-shaped cooling channel 62 has an upper channel section 62A parallel to and closest to upper edge 56, a vertical channel section 62V perpendicular to upper and lower edges 56 and 58, and a lower channel section 62B parallel to and closest to lower edge 58. Upper and lower channel sections 62A and 62B have respective ends 63A and 63B that terminate at a slot 66 in outer surface 54. Slot 66 is parallel to vertical channel section 62V and is where the corresponding spoke 80 interfaces with inner ring 50, as described below. The example inner ring 50 of FIG. 3 includes six U-shaped cooling channels 62 (three are shown in phantom) corresponding respectively to the six spokes 80-1 through 80-6 (see, e.g., FIG. 2).

Spoke Cooling Channels and Flow Directions

Figure 4A:
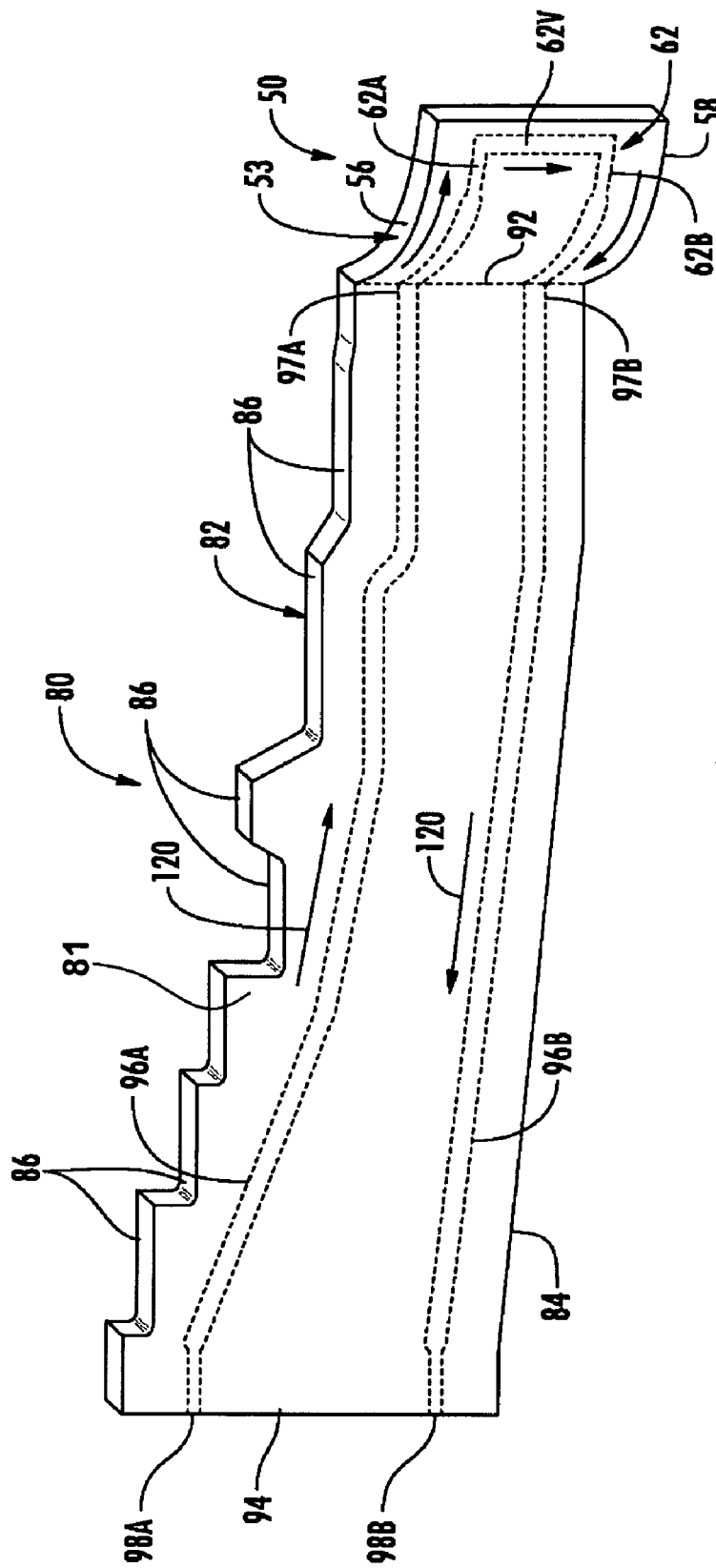
FIGS. 4A and 4B are close-up side views of an example spoke and inner ring portion showing clockwise and counter-clockwise cooling fluid flow directions through the spoke and inner ring portion.
Figure 4B:
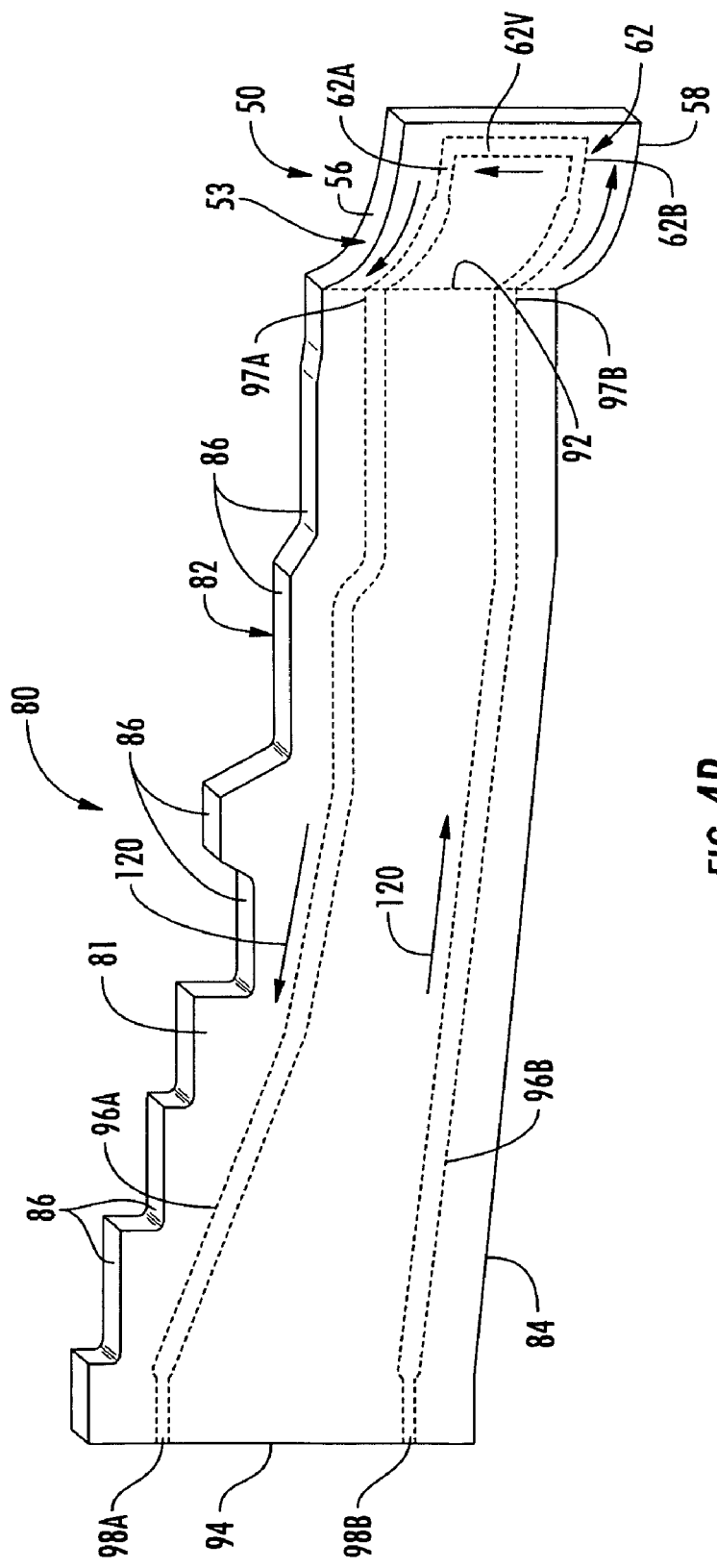

FIGS. 4A and 4B are close-up side views of an example spoke 80 and inner ring portion 53 showing two different cooling fluid flow directions through the spoke 80 and inner ring portion 53. Spoke 80 includes a body 81 with upper and lower edges 82 and 84, and spoke inner and outer ends 92 and 94. Body 81 includes upper and lower cooling channels 96A and 96B, with respective channel inner ends 97A and 97B at spoke inner end 92 and respective channel outer ends 98A and 98B at spoke outer end 94. In an example, lower edge 84 is generally smooth while upper edge 82 includes a number of flat steps 86 arranged to support respective edge portions of concentrically arranged GIC shells 200 as discussed below.

In an example, each spoke 80 is formed from first and second pieces that when mated (e.g., e-beam welded) form upper and lower channels 96A and 96B.

In forming spider 10, spokes 80 are connected to inner ring 50 with spoke ends 92 fitting within inner ring slots 66 so that spoke cooling channel inner ends 97A and 97B of upper and lower cooling channels 96A and 96B connect with inner ring cooling channel ends 63A and 63B of U-shaped cooling channel 62 of inner ring 50.

FIG. 4A shows cooling fluid 120 flowing in a direction that starts in upper cooling channel 96A and flows from outer ring 20 to inner ring 50. Cooling fluid 120 then flows through U-shaped channel 62 starting with upper channel section 62A, then vertical channel section 62V and then lower channel section 62B. Cooling fluid 120 then flows from inner ring 50 to outer ring 20 via lower cooling channel 96B. This cooling fluid flow direction is referred to herein as being "clockwise." FIG. 4B shows the same spoke 80 and inner ring portion 53 as FIG. 4A but with cooling fluid 120 flowing in the opposite or "counterclockwise" direction relative to the flow direction of FIG. 4A. Further, the cooling fluid flow directions of FIG. 4A and FIG. 4B are referred to as being in the "opposite direction," or just "opposite."

Cooling-fluid Flow Path

Figure 5:
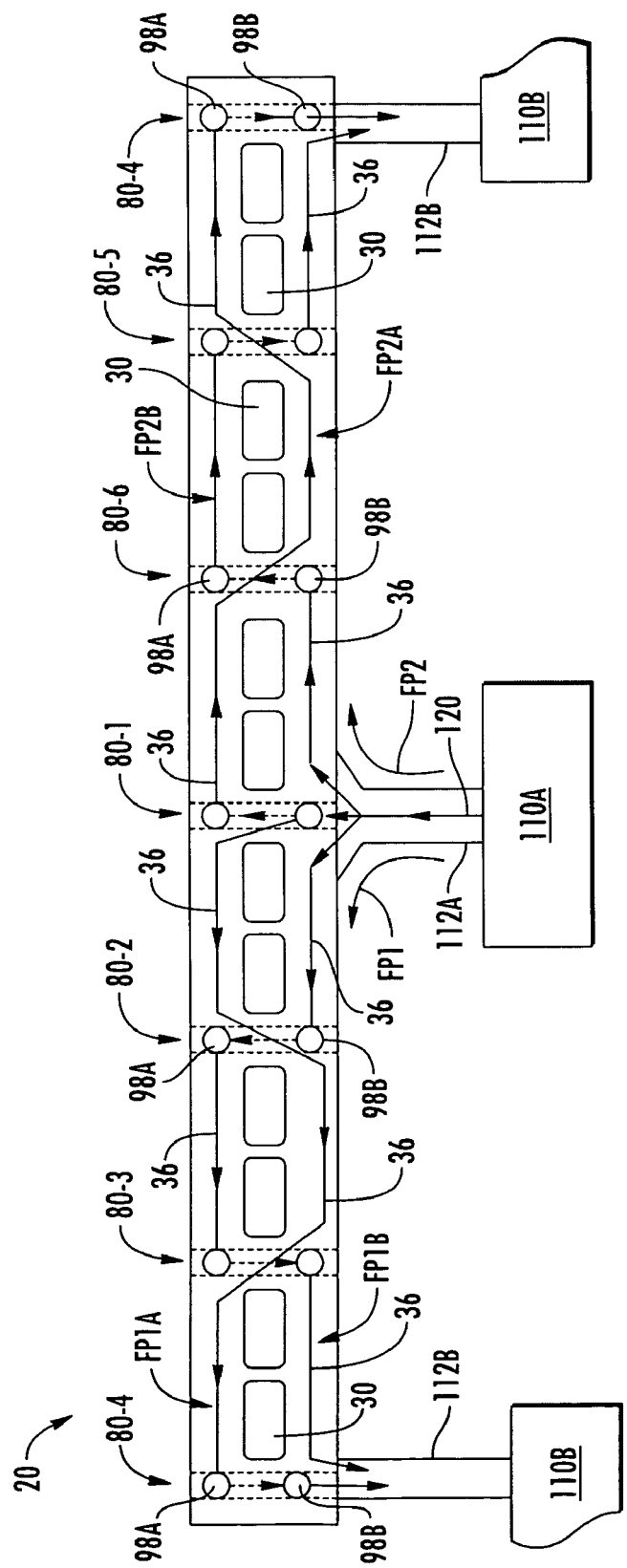
FIG. 5 is a schematic diagram of an "unfolded" outer ring that illustrates an example general flow path of the cooling fluid through the spider.

FIG. 5 is a schematic diagram of an "unfolded" outer ring 20 that illustrates the general flow of cooling fluid 120 through spider 10. The outer ends 98A and 98B of the upper and lower spoke cooling channels of spokes 80-1 through 80-6 are also shown. Spoke 80-4 is shown twice to emphasize the wrap-around effect in the unfolded diagram. The cooling-fluid output manifold 110B is shown as broken into two halves at the two spokes 80-4 for ease of illustration.

Cooling fluid 120 flows through spider 10 over a general cooling-fluid flow path that in an example has multiple branches. General cooling-fluid flow path starts at input cooling-fluid manifold 110A and enters outer ring 20 via an input pipe 112A at input point $P_{IN}$. At this point, general cooling-fluid flow path diverges in opposite directions to form respective branch flow paths FP1 and FP2 that traverse different spokes 80 and inner ring portions 53, and that meet up and exit outer ring 20 at output pipe 112B at output point $P_{OUT}$. In an example embodiment, input point $P_{IN}$ and output point $P_{OUT}$ are preferably located 180° apart (see also FIG. 1). At output point $P_{OUT}$, cooling fluid 120 from branch flow paths FP1 and FP2 converge back into general cooling-fluid flow path and are directed to output of outer ring 20 to output cooling-fluid manifold 110B via output pipe 112B.

Branch flow path FP1 is defined in part by outer ring cooling channel sections 36 that follows a zig-zag pattern all the way to from input pipe 112A to the upper channel outer end 98A of spoke 80-4. Branch flow path FP1 is also defined by other cooling channel sections 36 that connect a) input pipe 112A to the lower channel outer end 98B of spoke 80-2; b) upper channel outer end 98A of spoke 80-2 to the upper channel outer end 98A of spoke 80-3; and c) lower channel outer end 98B of spoke 80-3 to output pipe 112B located at spoke 80-4. Thus, cooling channel sections is 36 divide branch flow path FP1 into two flow sub-paths FP1A and FP1B.

Likewise, branch flow path FP2 is defined in part by corresponding outer ring cooling channel sections 36 that also follow a zig-zag pattern all the way to from upper channel outer end 98A of spoke 80-1 to upper channel outer end 98A of spoke 80-4. Branch flow path FP2 is also defined by additional outer ring cooling channel sections 36 that connect a)

input pipe 112A to the lower channel outer end 98B of spoke 80-6; b) upper channel outer end 98A of spoke 80-6 to the upper channel outer end 98A of spoke 80-5; and c) lower channel outer end 96B of spoke 80-5 to output pipe 112B located at spoke 80-4. Thus, the additional cooling channels 36 also divide branch flow path FP2 into two flow sub-paths FP2A and FP2B.

Looking at the branch flow paths FP1 and FP2 now in more detail, with reference to FIG. 5 and also to FIGS. 4A and 4B, sub-path FP1A follows a number of cooling channel sections 36 to upper channel outer end 98A of spoke 80-4. With reference now to FIG. 4A, sub-path FP1A follows a clockwise direction through spoke 80-4 and corresponding inner ring portion 53 and flows out of lower channel outer end 98B to output pipe 112B, and then into output cooling-fluid manifold 110B.

Sub-path FP1B follows an outer ring cooling channel section 36 from input pipe 112A to lower channel outer end 98B of spoke 80-2. With reference to FIG. 4B, sub-path FP1B follows a counterclockwise direction through spoke 80-2 and inner ring portion 53 to the next cooling channel section 36, which connects to upper channel outer end 98A of the adjacent spoke 80-3. With reference to FIG. 4B, sub-path FP1B follows a clockwise path through spoke 80-3 and corresponding inner ring portion 53 to the next outer ring channel section 36, which leads to output pipe 112B and then to output cooling-fluid output manifold 110B.

Sub-path FP2A enters lower channel outer end 98B of spoke 80-6 and then proceeds in the counterclockwise direction (FIG. 4B) through spoke 80-6 and corresponding inner ring portion 53, and then back to outer ring 20 and to a cooling channel section 36 therein, which connects to upper channel outer end 98A of spoke 80-4. Sub-path FP2A then follows a clockwise direction around spoke 80-4 and inner ring portion 53 back to outer ring 20 and to output pipe 112B and then to output cooling-fluid manifold 110B.

Sub-path FP2B is essentially symmetrical with sub-path FP1B and is connected to spokes 80-6 and 80-5 via respective cooling channel sections 36, so that the sub-path traverse spokes 80-6 and 80-5 and the respective inner ring portions 53 in reverse order, i.e., clockwise in spoke 80-6 (FIG. 4A) and counterclockwise in spoke 80-5 (FIG. 4B), before connecting to output cooling-fluid manifold 110B via output pipe 112B.

Spider with GIC Shells

Figure 6A:
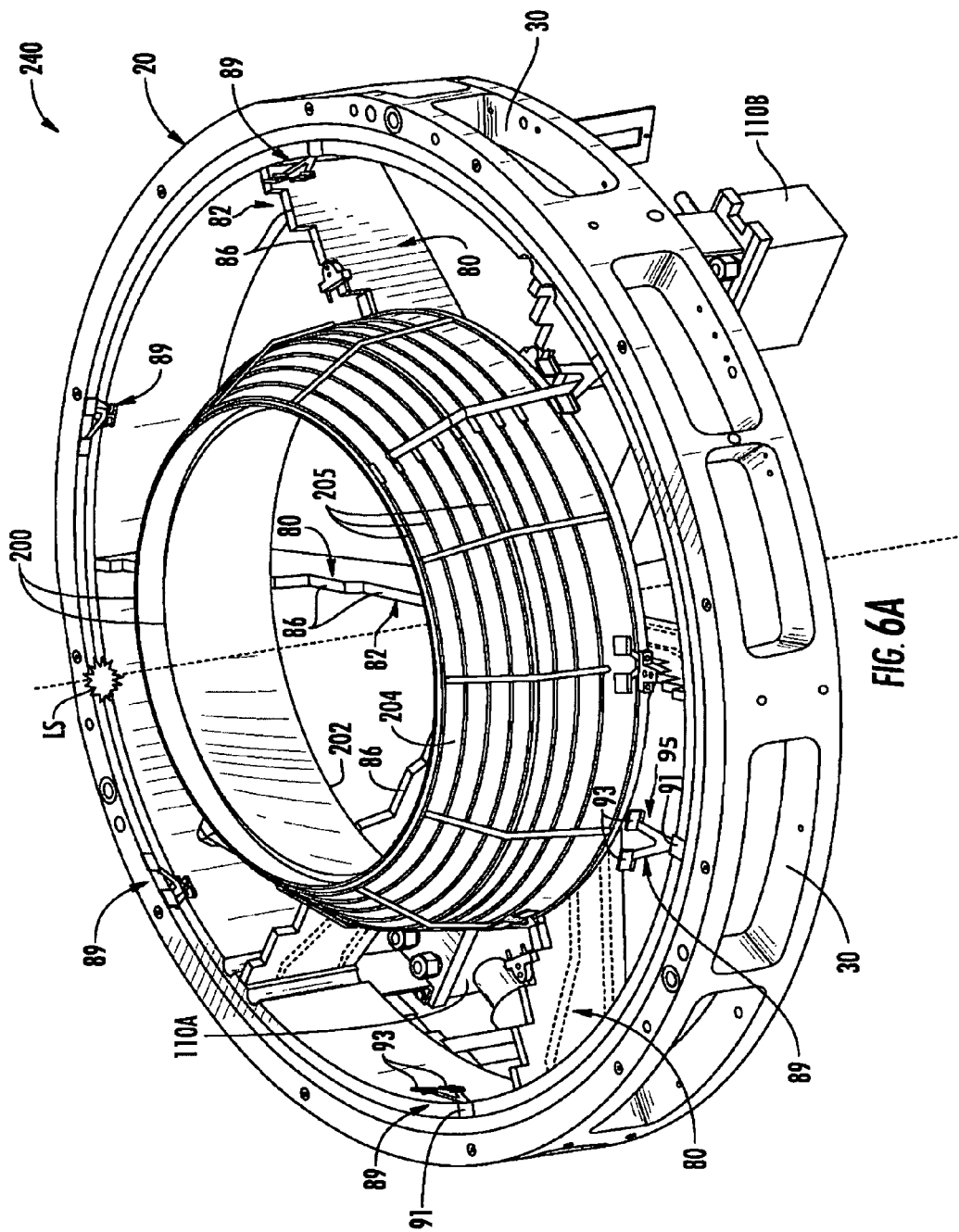
FIGS. 6A and 6B are a perspective views similar to that of FIG. 2, but showing the cooled spider supporting two GIC shells in the process of forming a GIC mirror (FIG. 6A) and a full complement of nine GIC shells that form the final GIC mirror (FIG. 6B)
Figure 6B:
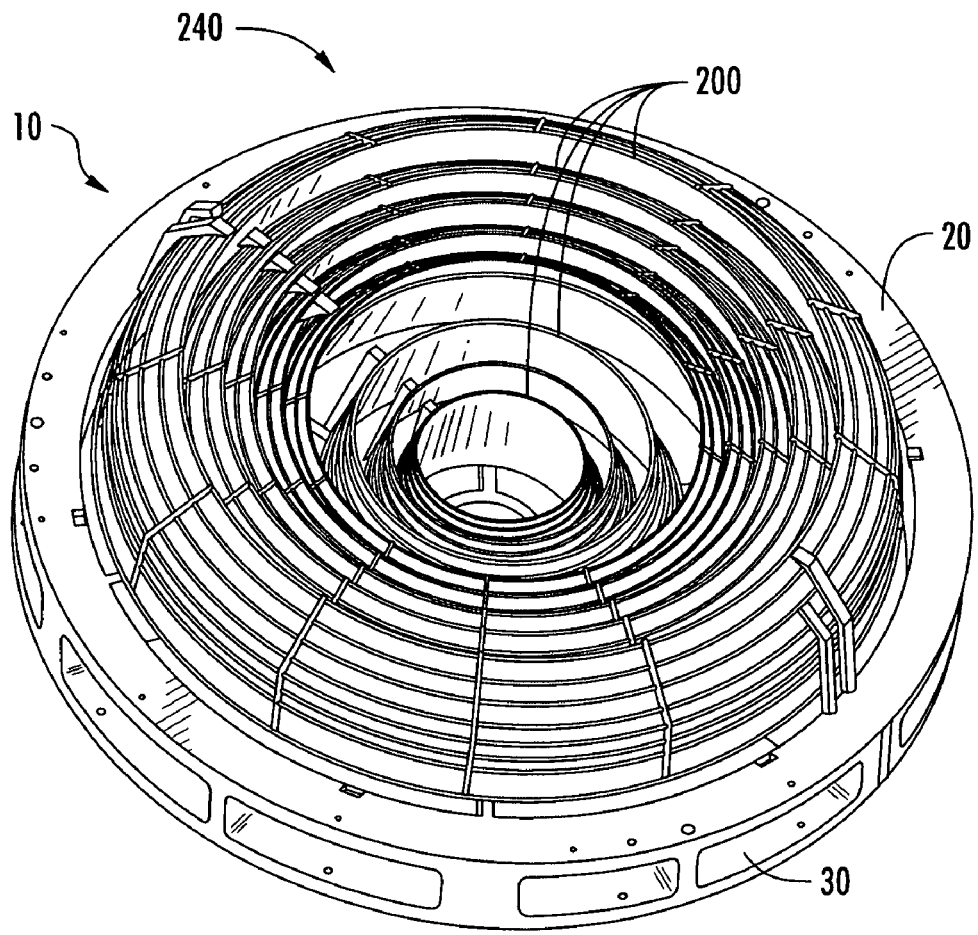

FIG. 6A is a perspective view of spider 10 supporting two GIC shells 200 in the process forming a GIC mirror 240 having nine shells, as shown in FIG. 6B. Each GIC shell 200 includes an edge 202 and an outer surface 204. An example GIC shell 200 includes cooling lines 205 arranged on outer surface 204, as described in U.S. patent application Ser. No. 12/592,735, which application is incorporated by reference herein.

An EUV light source LS is also shown relative to GIC mirror 240 for reference. Spider 10 is configured to operably support one or more GIC shells 200 in a spaced-apart and concentric configuration while not substantially blocking EUV radiation from being relayed from EUV light source LS to a GIC mirror intermediate focus IF.

In one example, GIC shell edges 202 are supported by spokes 80 at steps 86. Also in an example, clips 89 are also attached (clipped) to spokes 80 at upper edge 82 and are secured the GIC shells 200 and to the spokes. An example clip 89 includes a mounting base 91 from which extends a forked section 95 having two pads 93. In forming the GIC mirror 240, the innermost GIC shell 200 is arranged on spider 10 with the GIC shell edge 202 placed on the corresponding steps 86 of spokes 80. Steps 86 support GIC shell 200 at respective portions of the GIC shell edge 202. Clips 89 are then arranged on spokes 80 adjacent GIC shell outer surface 204, with the clip mounting bases 91 attached to corresponding steps 86 so that pads 93 rest against the GIC shell outer surface. The GIC shell 200 is then optically aligned and a laser is used to irradiate pads 93 and mounting bases 91 to secure (i.e., laser weld) the GIC shell 200 to spider 10 in a fixed position. This process is repeated for the remaining GIC shells 200 to form the completed GIC mirror 240 shown in FIG. 6B. Note that in one example embodiment, for the outermost GIC shell 200 the clip mounting bases 91 are clipped to inside lip 23 on outer ring 20 and then laser-welded thereto.

EUV Lithography System with Cooled Spider

Figure 7:
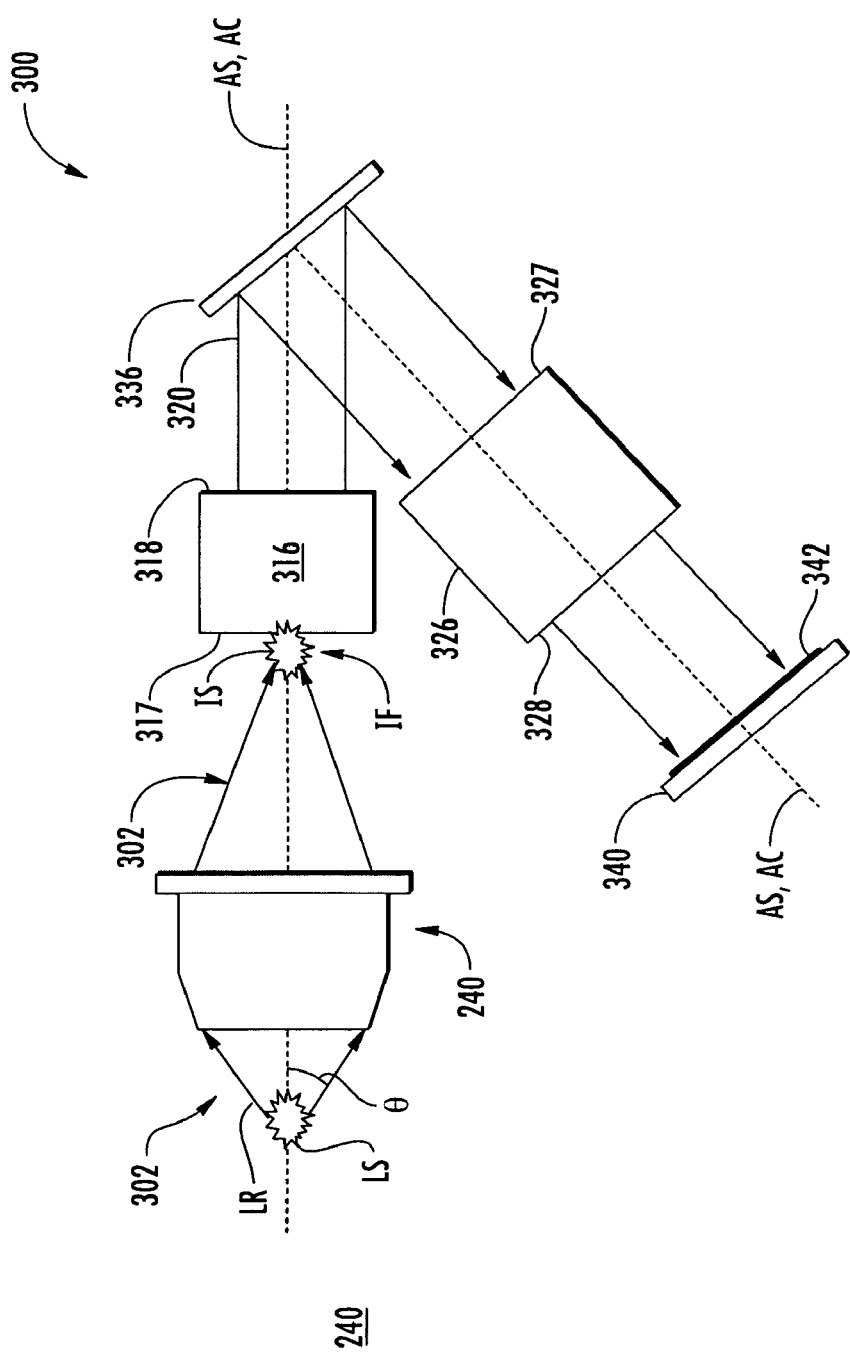
FIG. 7 is a schematic diagram of an EUV lithography system that includes the cooled spider of the present invention.

FIG. 7 is an example EUV lithography system ("system") 300 that includes the cooled spider 10 according to the present invention. Example EUV lithography systems are disclosed, for example, in U.S. Patent Application Publications No. US2004/0265712A1, US2005/0016679A1 and US2005/0155624A1, which Application Publications are incorporated herein by reference.

System 300 includes a system axis AS and EUV light source LS, such as a hot plasma source, that emits working EUV radiation 302 at λ=13.5 nm. EUV radiation 302 is generated, for example, by an electrical discharge source (e.g., a discharged produced plasma, or DPP source), or by a laser beam (laser-produced plasma, or LPP source) on a target of Lithium, Xenon or Tin. EUV radiation 302 emitted from such a LPP source may be roughly isotropic and, in current DPP sources, is limited by the discharge electrodes to a source emission angle of about θ=60° or more from optical axis AS. It is noted that the isotropy of the LPP source will depend on the mass of the target pellet. For relatively high mass targets, the emission is anisotropic, with most of the emerging radiation headed back toward the laser beam due to absorption in the forward direction by the target mass. For a low mass LPP target, which is almost entirely ionized by the laser, the emission is much closer to isotropic.

System 300 includes a EUV GIC mirror 240 that includes cooled spider 10. EUV GIC mirror 240 is arranged adjacent and downstream of EUV light source LS, with collector axis AC lying along system axis AS. EUV GIC mirror 240 collects working EUV radiation 302 (i.e., light rays LR) from EUV light source LS located at source focus and the collected radiation forms intermediate source image IS at intermediate focus IF. An illumination system 316 with an input end 317 and an output end 318 is arranged along system axis AS and adjacent and downstream of EUV GIC mirror 240 with the input end 317 adjacent the EUV GIC mirror. Illumination system 316 receives at input end 317 EUV radiation 302 from intermediate source image IS and outputs at output end 318 a substantially uniform EUV radiation beam 320 (i.e., condensed EUV radiation). Where system 300 is a scanning type system, EUV radiation beam 320 is typically formed as a substantially uniform line of EUV radiation 302 at reflective reticle 336 that scans over the reflective reticle.

A projection optical system 326 is arranged along (folded) system axis AS downstream of illumination system 316. Projection optical system 326 has an input end 327 facing illumination system output end 318, and an opposite output end 328. A reflective reticle 336 is arranged adjacent the projection optical system input end 327 and a semiconductor wafer 340 is arranged adjacent projection optical system output end 328. Reflective reticle 336 includes a pattern (not shown) to be transferred to semiconductor wafer 340, which includes a photosensitive coating (e.g., photoresist layer) 342. In operation, the uniformized EUV radiation beam 320 irradiates reflective reticle 336 and reflects therefrom, and the pattern thereon is imaged onto surface of photosensitive coating 342 of semiconductor wafer 340 by projection optical system 326. In a scanning system 300, the reticle image scans over the photosensitive surface of photosensitive coating 342 to form the pattern over the exposure field. Scanning is typically achieved by moving reflective reticle 336 and semiconductor wafer 340 in synchrony.

Once the reticle pattern is imaged and recorded on semiconductor wafer 340, the patterned semiconductor wafer 340 is then processed using standard photolithographic and semiconductor processing techniques to form integrated circuit (IC) chips.

Note that in general the components of system 300 are shown lying along a common folded axis AS in FIG. 7 for the sake of illustration. One skilled in the art will understand that there is often an offset between entrance and exit axes for the various components such as for illumination system 316 and for projection optical system 326.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A cooled spider for a grazing-incident collector (GIC) that includes one or more GIC shells, comprising:
    an outer ring that includes a plurality of cooling channel sections;
    an inner ring that includes a plurality of cooling channel loops each covering a portion of the inner ring; and
    a plurality of spokes that mechanically connect the inner and outer rings, with each spoke including a pair of cooling channels that fluidly connect to different cooling channel sections in the outer ring and to respective ends of the corresponding cooling channel loop in the inner ring to form a cooling-fluid flow path through the cooled spider, with each spoke configured to mechanically support an edge portion of the one or more GIC shells.

2. The cooled spider of claim 1, wherein the cooling-fluid flow path includes spaced apart input and output points at the outer ring, and two branch flow paths that travel in opposite directions around the cooled spider between the input and output points.

3. The cooled spider of claim 2, wherein the input and output points are spaced apart by substantially 180°.

4. The cooled spider of claim 1, further comprising input and output cooling-fluid manifolds respectively fluidly connected to the cooling-fluid flow path at the input and output points.

5. The cooled spider of claim 4, wherein the input and output cooling-fluid manifolds are respectively fluidly connected to respective outer cooling channel sections.

6. The cooled spider of claim 1, wherein each spoke comprises first and second sections that when mated form the connecting cooling channels.

7. The cooled spider of claim 1, wherein each spoke includes an upper edge configured to support respective edge portions of the one or more GIC shells.

8. The cooled spider of claim 1, wherein the cooling channel sections in the outer ring, the cooling channel loops in the inner ring, and the cooling channels in the spokes are configured so that the cooling-fluid flow path traverses at least two adjacent spokes in opposite directions.

9. The cooled spider of claim 1, wherein the outer ring, the inner ring and the spokes are made at least one of Inconel, aluminum, stainless steel, nickel and nickel alloy.

10. A GIC system comprising:
    the cooled spider of claim 1; and
    one or more GIC shells operably supported by the cooled spider in a spaced-apart configuration.

11. The GIC system of claim 10, wherein each of the one or more GIC shells has an edge with a portion of each edge supported by the spokes, and wherein a plurality of clips attached to the spokes hold each shell in place.

12. An extreme ultraviolet (EUV) lithography system for illuminating a reflective reticle, comprising:
    a source of EUV radiation;
    the cooled spider of claim 1;
    one or more GIC shells supported by the cooled spider and configured to receive the EUV radiation and form collected EUV radiation; and
    an illuminator configured to receive the collected EUV radiation and form condensed EUV radiation for illuminating the reflective reticle.

13. The EUV lithography system of claim 12 for forming a patterned image on a photosensitive semiconductor wafer, further comprising:
    a projection optical system arranged downstream of the reflective reticle and configured to receive reflected EUV radiation from the reflective reticle and form therefrom the patterned image on the photosensitive semiconductor wafer.

14. A method of maintaining one or more grazing-incidence collector (GIC) shells in a spaced-apart configuration as part of a GIC system having an extreme ultraviolet (EUV) light source; comprising:
    providing the cooled spider of claim 1;
    adding the one or more GIC shells to the cooled spider to form a GIC system that receives and focuses EUV light from the light source;
    activating the light source to generate the EUV light; and
    flowing the cooling fluid over the cooling-fluid flow path to cool the cooled spider.

15. The method of claim 14, wherein the cooling-fluid flow path includes input and output points, and including dividing the cooling-fluid flow path into two branch flow paths that travel in opposite directions around the cooled spider from the input point to the output point.

16. The method of claim 15, wherein the input and output points are located substantially 180° apart on the outer ring.

17. A cooled spider for a grazing-incident collector (GIC) having one or more GIC shells each with an edge, comprising:
    an outer ring having outer ring cooling channel sections;
    an inner ring having inner ring cooling channel sections; and
    spokes that mechanically connect the inner and outer rings, with each spoke including at least one cooling channel that fluidly connects to respective cooling channel sections of the inner and outer rings to form a cooling-fluid flow path through the cooled spider, wherein the spokes are configured to support the one or more GIC shells at their respective edges and in a spaced-apart and concentric configuration.

18. The cooled spider of claim 17, wherein:
    the inner ring cooling channel sections have a U-shape and cover respective portions of the inner ring; and
    each spoke includes first and second cooling channels that connect to respective first and second ends of the corresponding U-shaped inner ring cooling channel to form a cooling channel loop to and from the outer ring.

19. The cooled spider of claim 18, wherein the inner and outer ring cooling channel sections are configured so that at least two adjacent spokes have opposite cooling fluid flow directions.

20. The cooled spider of claim 18, further comprising:
input and output cooling-fluid manifolds configured to flow a cooling fluid over the cooling-fluid flow path and fluidly connected to the outer ring at input and output points that are substantially 180° apart.

21. A GIC system comprising:
The cooled spider of claim 17; and
the one or more GIC shells operably supported by the cooled spider at the GIC shell edges and in a spaced-apart and concentric configuration.

22. An extreme ultraviolet (EUV) lithography system for illuminating a reflective reticle, comprising:
a source of EUV radiation;
the cooled spider of claim 17;
one or more GIC shells operably supported by the cooled spider and configured to receive the EUV radiation and form collected EUV radiation; and
an illuminator configured to receive the collected EUV radiation and form condensed EUV radiation for illuminating the reflective reticle.

23. The EUV lithography system of claim 22 for forming a patterned image on a photosensitive semiconductor wafer, further comprising:
a projection optical system arranged downstream of the reflective reticle and configured to receive reflected EUV radiation from the reflective reticle and form therefrom the patterned image on the photosensitive semiconductor wafer.

24. A method of maintaining one or more grazing-incidence collector (GIC) shells in a spaced-apart configuration as part of a GIC system having an extreme ultraviolet (EUV) light source; comprising:
providing the cooled spider of claim 17;
adding the one or more GIC shells to the cooled spider in a configuration that receives and focuses EUV light from the light source;
activating the light source to generate the EUV light; and
flowing the cooling fluid through the cooling-fluid flow path to cool the cooled spider.

25. A method of cooling a spider that operably supports one or more shells of a grazing-incidence collector (GIC) mirror, comprising:
providing a spider having an outer ring and an inner ring mechanically and fluidly connected by a plurality of spokes and defining a cooling-fluid flow path through the spokes and respective portions of the inner ring; and
flowing a cooling fluid over the cooling-fluid flow path.

26. The method of claim 25, wherein the cooling-fluid flow path has input and output points that are substantially 180° apart and wherein the cooling-fluid flow path includes two branch flow paths that travel in opposite directions from the entrance point to the exit point.

* * * * *